(12) United States Patent
Chen et al.

(10) Patent No.: US 6,211,061 B1
(45) Date of Patent: Apr. 3, 2001

(54) DUAL DAMASCENE PROCESS FOR CARBON-BASED LOW-K MATERIALS

(75) Inventors: Chao-Cheng Chen, Matou; Ming-Huei Lui, Pauchino; Jen-Cheng Liu, Chia-Yih; Li-chih Chao, Fang-mei; Chia-Shiung Tsai, Hsin Chu, all of (TW)

(73) Assignee: Taiwan Semiconductor Manufactuirng Company, Hsin-Chu (TW)

( * ) Notice: Subject to any disclaimer, the term of this patent is extended or adjusted under 35 U.S.C. 154(b) by 0 days.

(21) Appl. No.: 09/431,536

(22) Filed: Oct. 29, 1999

(51) Int. Cl.[7] ................................................ H01L 21/4763
(52) U.S. Cl. ........................ 438/622; 438/636; 438/638
(58) Field of Search ..................................... 438/622, 623, 438/634, 636, 638, 637, 780

(56) References Cited

U.S. PATENT DOCUMENTS

| | | |
|---|---|---|
| 5,529,953 | 6/1996 | Shoda . |
| 5,635,423 | 6/1997 | Huang et al. . |
| 5,686,354 | 11/1997 | Avanzino et al. . |
| 5,741,626 | 4/1998 | Jain et al. ............... 430/314 |
| 5,863,835 | 1/1999 | Yoo et al. ............... 438/666 |
| 5,869,395 | 2/1999 | Yim ........................ 438/637 |
| 5,904,565 | 5/1999 | Nguyen et al. ......... 438/687 |
| 6,107,177 | * 8/2000 | Lu et al. .................. 438/597 |
| 6,140,226 | * 10/2000 | Grill et al. .............. 438/637 |
| 6,156,640 | * 12/2000 | Tsai et al. ............... 438/636 |
| 6,156,642 | * 12/2000 | Wu et al. ................. 438/638 |

* cited by examiner

Primary Examiner—Tuan H. Nguyen
(74) Attorney, Agent, or Firm—George O. Saile; Stephen B. Ackerman; William J. Stoffel

(57) ABSTRACT

A method for forming a dual damascene structure in a carbon-based, low-K material. The process begins by providing a semiconductor structure having a first metal pattern thereover, wherein the first metal pattern has a first barrier layer thereon. An organic dielectric layer is formed on the first barrier layer, and a hard mask layer is formed on the dielectric layer. The hard mask layer and the dielectric layer are patterned to form a trench. A second barrier layer is formed over the hard mask layer and on the bottom and sidewalls of the trench. A barc layer is formed over the second barrier layer, thereby filling the trench. The barc layer, the second barrier layer, and the dielectric layer are patterned to form a via opening, preferably using a photoresist mask. The barc layer is patterned without faceting the edges of the via opening due to the second barrier layer. The barc layer and the etch mask are removed by the dielectric layer etch. The first barrier layer and the second barrier layer are removed. A third barrier layer is formed on the bottom and sidewalls of the trench, on the sidewalls of the via opening, and on the first metal pattern through the via opening. The trench and the via opening are filled with metal to form a damascene structure.

14 Claims, 6 Drawing Sheets

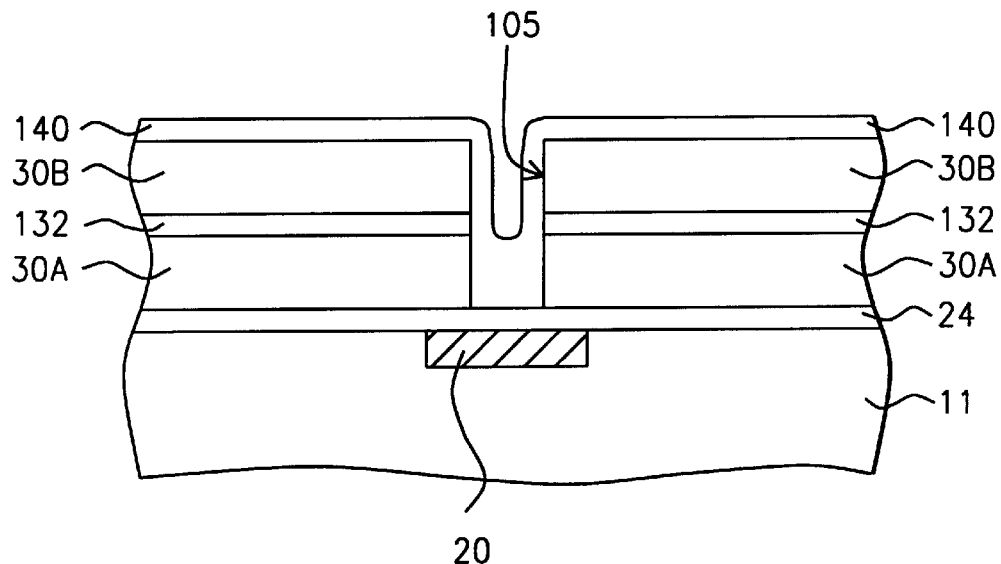
FIG. 1A – Prior Art
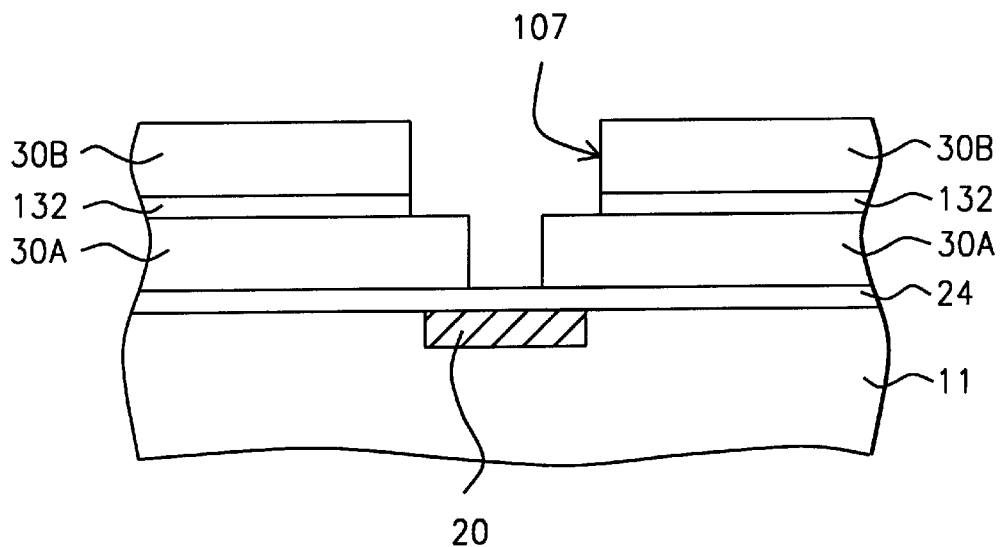
FIG. 1B – Prior Art

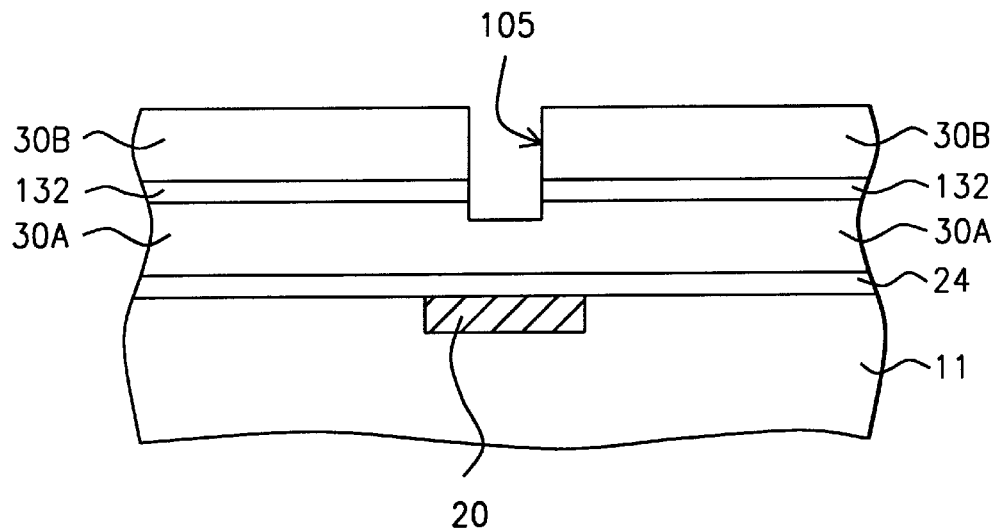
FIG. 2A – Prior Art
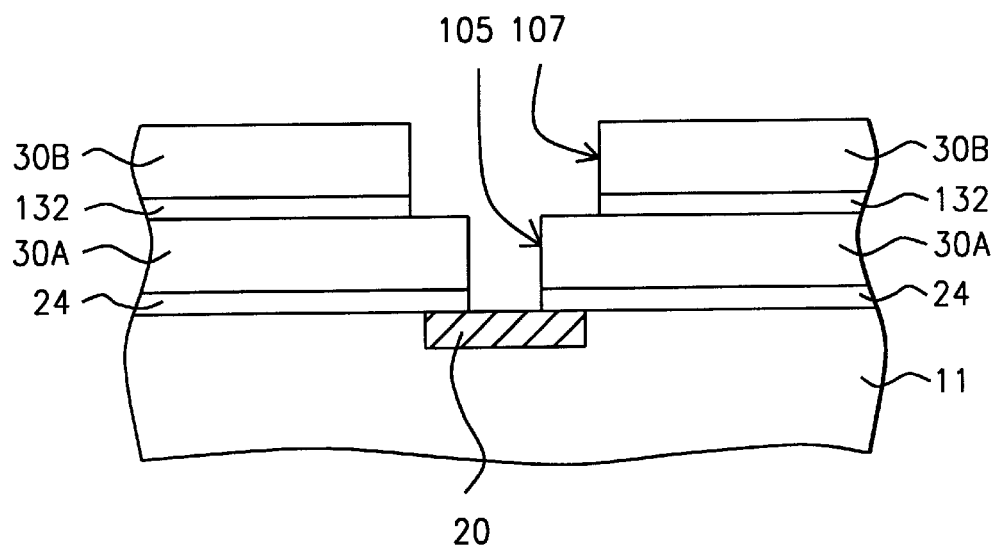
FIG. 2B – Prior Art

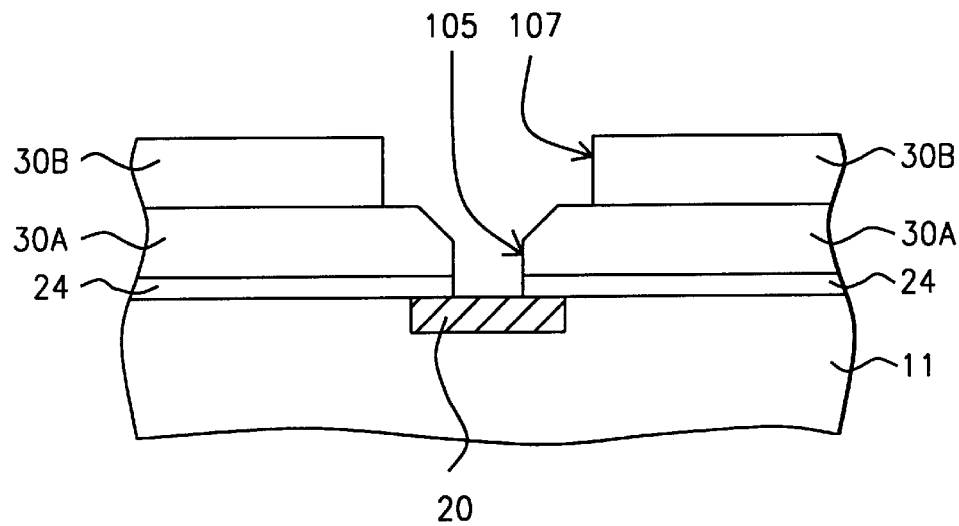
FIG. 2C – Prior Art
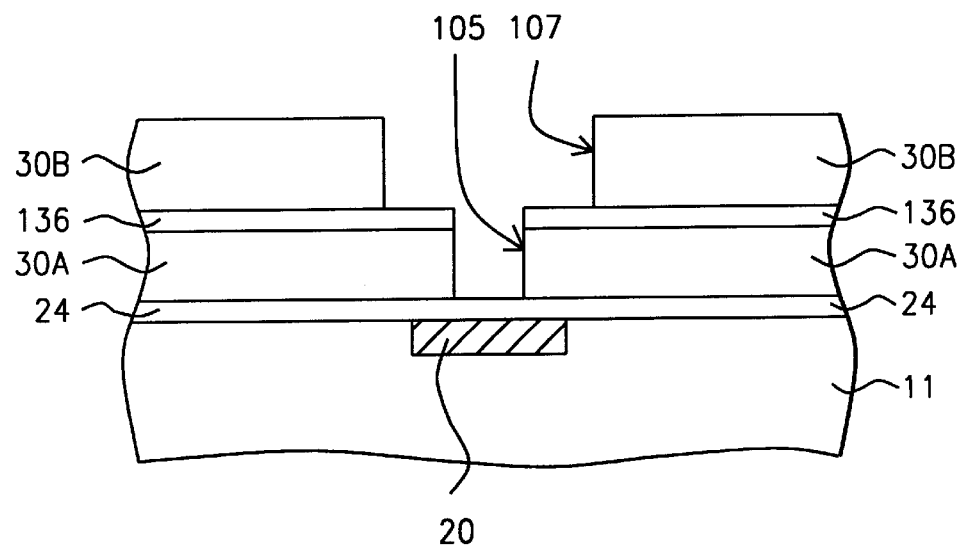
FIG. 3 – Prior Art

DUAL DAMASCENE PROCESS FOR CARBON-BASED LOW-K MATERIALS

DESCRIPTION OF THE PRIOR ART

In current IC fabrication, connections between metal levels, such as copper, which are separated by dielectric interlevels, are typically formed with a damascene method of via formation between metal levels. The first metal pattern is first completely covered with dielectric, such as silicon dioxide. A trench is patterned into the dielectric layer. A via is patterned from the trench, through the dielectric layer, to the first metal pattern. A metal film, such as copper, is then used to fill the via and the trench. A layer consisting of dielectric with a metal via through it now overlies the first metal pattern. The excess metal can be removed using a CMP process, as is well known in the art. The result is an "inlaid", or damascene metal structure.

As devices continue to be smaller, less expensive, and more powerful, smaller geometries and denser packaging are required for integrated circuits. Conductors having high resistivity create conduction paths with high impedance and large propagation delays, resulting in shorter device life and reliability problems. High-K dielectrics have cause high capacitance resulting in shorter device life and reliability problems. Copper is a particularly attractive material for use in interconnects and vias, due to its high conductivity. Organic low-K materials such as FLARE, SILK, and PAE are attractive for use as dielectrics, due to the reduced capacitance. However, there are fabrication problems associated with a copper dual damascene process with an organic, low-K dielectric material, due to the lack of etch selectivity between the organic, low-K dielectric material and bottom anti-reflective coating (barc), and due to the undesireability of using a high-K etch stop layer.

A first dual damascene process known to the inventors is a via first with barc filling. In this process, a via opening is formed through the inter-metal dielectric layer (IMD) before a trench is formed. A bottom anti-reflective coating (barc) is deposited in the via opening and over the IMD. The IMD is then patterned to form a trench, using photolithography and etching. The barc is also removed during this etch. However, for dielectric layers composed of organic, low-K materials, there is not sufficient etch selectivity between the organic low-K material and the barc. If barc material remains it can not easily be removed.

A second dual damasene process known to the inventors is a partial via first without barc filling. In this process, a via opening is formed part-way through the inter-metal dielectric layer (IMD) before a trench is formed. Because the underlying metal level is not exposed, no barc is used. However, to prevent faceting at the edge of the via opening during trench etching for an organic, low-K dielectric material, an additional high-K etch stop layer is required at the intended level for the bottom of the trench.

A third dual damascene process known to the inventors is a self-aligned dual damascene process, wherein the via is formed first. In this process, a lower IMD layer and an overlying hard mask are patterned to form a via opening through the lower IMD layer and an overlying hard mask to the underlying first metal level. Then an upper IMD layer is formed over the hard mask and in the via opening. A trench pattern is formed in the upper IMD layer, stopping at the hard mask, except where the via opening was formed in the hard mask; thereby forming a dual damascene opening for the trench and via. However, for an organic low-K dielectric material, a high-K material hard mask is required to provide etch selectivity between the hard mask and the organic, low-K dielectric layer.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,904,565 (Nguyen et al.) shows a dual damascene process using barrier layers and forming via and trench steps.

U.S. Pat. No. 5,529,953 (Shoda) shows a dual damascene shaped opening, selective deposition of conductive layers having different deposition times for tungsten at the bottom of the contact hole and at the bottom of the trench; thereby allowing the damascene structure to be formed without voids or cracks.

U.S. Pat. No. 5,863,835 (Yoo et al.) shows a dual damascene shaped interconnect by forming and filling a contact hole opening to form a contact plug in an IMD layer, then forming and filling an interconnect region surrounding the top portion of the contact plug.

U.S. Pat. No. 5,869,395 (Yim) shows a dual damascene process using a barrier layer.

U.S. Pat. No. 5,741,626 (Jain et al.) teaches a dual damascene process using an etch barrier between IMD1 & IMD2.

U.S. Pat. No. 5,635,423 (Huang et al.) and U.S. Pat. No. 5,686,354 (Avanzino et al.) show other dual damascene processes.

SUMMARY OF THE INVENTION

It is an object of the present invention to provide a method for forming a dual damascene structure in a carbon-based, low-K material.

It is another object of the present invention to provide a method for forming a copper dual damasene structure in a carbon-based, low-K material without faceting at the edge of the via opening, and without using a high-K etch stop layer.

It is yet another object of the present invention to provide a method for forming a dual damascene structure in a carbon-based, low-K material, without increasing line to line capacitance.

To accomplish the above objectives, the present invention provides a method for forming a dual damascene structure in a carbon-based, low-K material. The process begins by providing a semiconductor structure having a first metal pattern thereover, wherein the first metal pattern has a first barrier layer thereon. An organic dielectric layer is formed on the first barrier layer, and a hard mask layer is formed on the dielectric layer. The hard mask layer and the dielectric layer are patterned to form a trench. A second barrier layer is formed over the hard mask layer and on the bottom and sidewalls of the trench. A barc layer is formed over the second barrier layer, thereby filling the trench. The barc layer, the second barrier layer, and the dielectric layer are patterned to form a via opening. The barc layer is removed without faceting the edges of the via opening due to the second barrier layer. The first barrier layer and the second barrier layer are removed. A third barrier layer is formed on the bottom and sidewalls of the trench, on the sidewalls of the via opening, and on the first metal pattern through the via opening. The trench and the via opening are filled with metal to form a damascene structure. The main steps of the present invention are summrized in table 1.

TABLE 1

| FIG. | Process Step |
|---|---|
| 4 | etch trench 35 in low-K dielectric layer 30 using an etch chemistry of $N_2$, $O_2$, $H_2$ or with additives like $CH_2F_2$ or $CH_4$ |
| 5A | form second barrier layer 36 in trench 35 |
| 5A | form BARC layer 40 on second barrier layer 36 |
| 5B | form etch mask for via opening 45 etch |
| 6A | etch via opening 45 in BARC layer 40 using $N_2/H_2$ reactive ion etch to form via 45 |
| 6A | etch via opening 45 in second barrier layer 36 using CF4/Ar/O2 reactive ion etch |
| 6A | etch via opening 45 in low-K dielectric layer 30 using a reactive ion etch with N2/O2/H2 or other additives, stopping on first barrier layer 24 and using second barrier layer 36 to protect low-K edge, the photoresist etch mask 42 and the barc layer 40 are also removed by this etch process |
| 6B | remove second barrier layer 36 on bottom of trench 35 and first brrier layer on bottom of via opening 45 using $CF_4/Ar/O_2$ reactive ion etch |
| 7 | form third barrier layer 50 |
| 7 | form metal plug |

The present invention provides considerable improvement over the prior art. Most importantly, the present invention provides a method for forming a dual damascene structure in an organic, low-K dielectric layer without inducing line-to-line capacitance degradation or dielectric damage.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1A & 1B illustrate sequential sectional views of a first process for forming a dual damascene structure in an organic, low-K dielectric layer, known by the inventors to have a problem.

FIGS. 2A, 2B & 2C illustrate sequential sectional views of a second process for forming a dual damascene structure in an organic, low-K dielectric layer, known by the inventors to have a problem.

FIG. 3 illustrates a sectional view of a third process for forming a dual damascene structure in an organic, low-K dielectric layer, known by the inventors to have a problem.

DETAILED DESCRIPTION OF THE INVENTION

Figure 4:
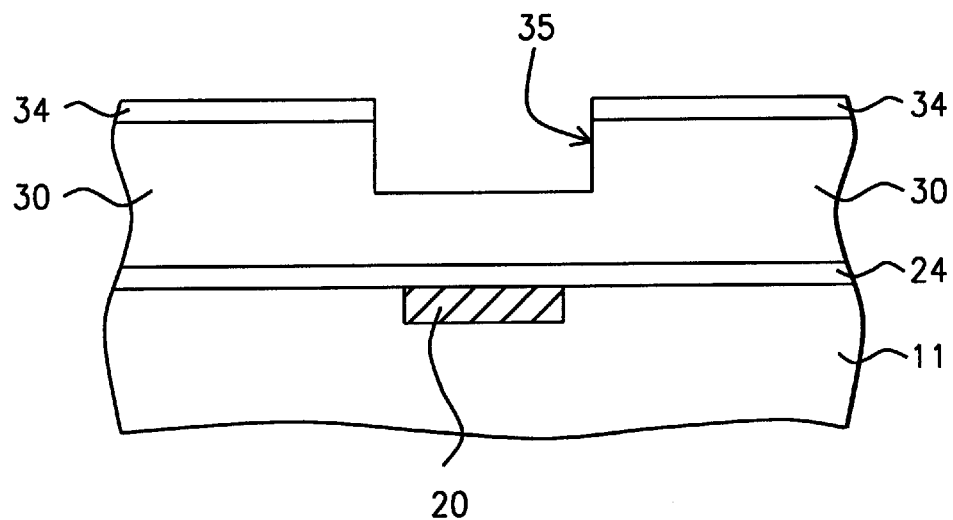
FIGS. 4, 5A, 5B, 6A, 6B & 7 illustrate sequential sectional views of a process for forming a dual damascene structure in an organic, low-K dielectric layer, according to the present invention.

The present invention will be described in detail with reference to the accompanying drawings. The present invention provides a method for forming a dual damascene structure in an organic, low-K dielectric layer.

Problem Identified by the Inventors-FIGS. 1A, 1B, 2A, 2B, 2C & 3

FIGS. 1A & 1B illustrate a first process for forming a dual damascene structure in an organic, low-K dielectric layer, known by the inventors to have a problem. Referring to FIG. 1, the problem process begins by providing a semiconductor structure (11). Semiconductor structure (11) should be understood to possibly comprise a substrate comprised of semiconducting material such as silicon or germanium, or a silicon on insulator structure (SOI) as is known in the art. Semiconductor structure (11) should be understood to possibly further include one or more conductive layer (such as metal or silicon) and/or insulating layers, and one or more active or passive devices formed in or over the substrate or the like.

Still referring to FIG. 1A, a first metal layer is formed on the semiconductor structure (11). The first metal layer is patterned to form a first metal pattern (20). A first barrier layer (24) is formed on the first metal pattern (20).

A carbon-based (organic), low-K dielectric layer (30) is formed over the first barrier layer (24). A lower dielectric layer (30A) is preferably formed to a thickness of between about 4000 Angstroms and 8000 Angstroms. An trench etch stop layer (132) is preferably formed over the lower dilectric layer (30A). An upper dielectric layer (30B) is formed over the trench etch stop layer (132).

Still referring to FIG. 1A, the upper dielectric layer (30B), the trench etch stop layer (132) and the lower dielectric layer (30A) are patterned to form a via opening (105). A bottom anti-reflective coating (barc) layer (140) is deposited over the upper dielectric layer (30B) and in the via opening (105) to prevent pattern distortion during the subsequent trench photolithography step.

Referring to FIG. 1B, the upper dielectric layer (30B) is patterned to form a trench (107), stopping on the etch stop layer (132), and the first barrier layer (24) is removed from the bottom of the via opening (105) and the trench etch stop layer (132) is removed from the bottom of the trench (107). A metal material is deposited in the via opening (105) and the trench (107) and planarized to form a dual damascene structure.

However, for an organic, low-K dielectric, there is poor etch selectivity between the barc layer (132) and the organic, low-K dielectric layer (30), and if the barc layer is not completely removed during the etch, it can not be easily removed subsequently, causing a contamination problem. Over etching can damage to the dielectric layer causing high capacitance and related performance and reliability problems.

FIGS. 2A, 2B, and 2C illustrate a second process for forming a dual damascene structure in an organic, low-K dielectric layer, known by the inventors to have a problem. Referring to FIG. 2A, process begins by providing a semiconductor structure (11). As with the first process, semiconductor structure is intended to be explanatory, not to be a limitation.

Still referring to FIG. 2A, a first metal layer is formed on the semiconductor structure (11). A first barrier layer is formed on the first metal layer, and the first barrier layer and the first metal layer are patterned to form a first metal pattern (20) having a first barrier layer (24) thereon as is known in the art.

A carbon-based (organic), low-K dielectric layer (30) is formed over the first barrier layer (24). A lower dielectric layer (30A) is preferably formed to a thickness of between about 4000 Angstroms and 8000 Angstroms. Then, a trench etch stop layer (132) is preferably formed over the lower dilectric layer (30A), and an upper dielectric layer (30B) is formed over the trench etch stop layer (132).

Still referring to FIG. 2A, the upper dielectric layer (30B) and the trench etch stop layer (132) are patterned to form a via opening (105). The via opening may extend into the lower dielectric layer (30A) less than 200 Angstroms.

Referring to FIG. 2B, the upper dielectric layer (30B) is patterned to form a trench (107), stopping on the etch stop layer (132). The first barrier layer (24) is removed from the bottom of the via opening (105) and the trench etch stop layer (132) is removed from the bottom of the trench (107). A metal material is deposited in the via opening (105) and the trench (107) and planarized to form a dual damascene structure.

However, the trench etch stop layer (132), which is preferably oxide-based to provide etch selectivity, increases the overall capacitance, causing performance and reliability problems. As shown in FIG. 2C, if the oxide-based etch stop layer (132) is omitted, the edge of the via opening (105) will become faceted during the trench etch.

FIG. 3 illustrates a third process for forming a dual damascene structure in an organic, low-K dielectric layer, known by the inventors to have a problem. The third (self-align-via first) process begins by providing a semiconductor structure (11). As with the first process, semiconductor structure is intended to be explanatory, not to be a limitation.

Still referring to FIG. 3, a first metal layer is formed on the semiconductor structure (11). A first barrier layer is formed on the first metal layer, and the first barrier layer and the first metal layer are patterned to form a first metal pattern (20) having a first barrier layer (24) thereon as is known in the art.

A carbon-based (organic), low-K dielectric layer (30) is formed over the first barrier layer (24). A lower dielectric layer (30A) is preferably formed to a thickness of between about 4000 Angstroms and 8000 Angstroms. Then, a hard mask layer (136) is preferably formed over the lower dielectric layer (30A). The hard mask layer (136) and the lower dielectric layer (30A) are patterned to form a via opening (105). An upper dielectric layer (30B) is formed over the hard mask layer (136) and in the via opening (105).

Still referring to FIG. 3, the upper dielectric layer (30B) is patterned to form a via opening (105) and trench (107), using the hard mask layer (136) as a self-alignment mask. A metal material is then deposited in the via opening (105) and the trench (107) and planarized to form a dual damascene structure.

However, the hard mask layer (136), which needs to be composed of a high-K material to provide etch selectivity, increases the overall capacitance, causing performance and reliability problems.

Preferred Embodiment of the Present Invention-FIGS. 4, 5A, 5B, 6A, 6B & 7

The preferred embodiment of the present invention provides a method for forming a dual damascene structure in a carbon-based, low-K dielectric layer, without causing increased capacitance or damaging the dielectric layer.

Referring to FIG. 4, the preferred embodiment of the present invention begins by providing a semiconductor structure (11). Semiconductor structure (11) should be understood to possibly comprise a substrate comprised of semiconducting material such as silicon or germanium, or a silicon on insulator structure (SOI) as is known in the art. Semiconductor structure (11) should be understood to possibly further include one or more conductive layer (such as metal or silicon) and/or insulating layers, and one or more active or passive devices formed in or over the substrate or the like.

Still referring to FIG. 4, a first metal pattern (20) is formed on the semiconductor structure (11). A first barrier layer (24) is formed on the first metal pattern (20). For example, first metal pattern (20) can be a copper line, and semiconductor structure (11) can comprise a dielectric layer (e.g. IMD or ILD) over a silicon substrate. Alternatively, first metal pattern (20) can be a doped region of a silicon substrate. The first barrier layer (24) is preferably composed of silicon nitride, and preferably has a thickness of between about 300 Anfgstroms and 500 Angstroms.

A carbon-based (organic), low-K dielectric layer (30) is formed over the first barrier layer (24). The dielectric layer (30) can be comprised of PAE, FLARE, or SILK, and is preferably formed to a thickness of between about 1600 Angstroms and 7000 Angstroms, and having a value of K less than 3.0.

Still referring to FIG. 4, a hard mask layer (34) is formed on the dielectric layer (30). The hard mask can be composed of silicon dioxide or silicon oxynitride, and most preferably silicon oxynitride having a thickness of between about 1000 Angstroms and 3000 Angstroms. The hard mask layer (34) and the dielectric layer (30) are patterned to form a trench (35) in the dielectric layer (30). The trench (35) preferably has a width of at least 0.2 microns and a depth of between about 4000 Angstroms and 8000 Angstroms. Thr trench (35) is wet cleaned but preferably not dry ashed.

Figure 5A:
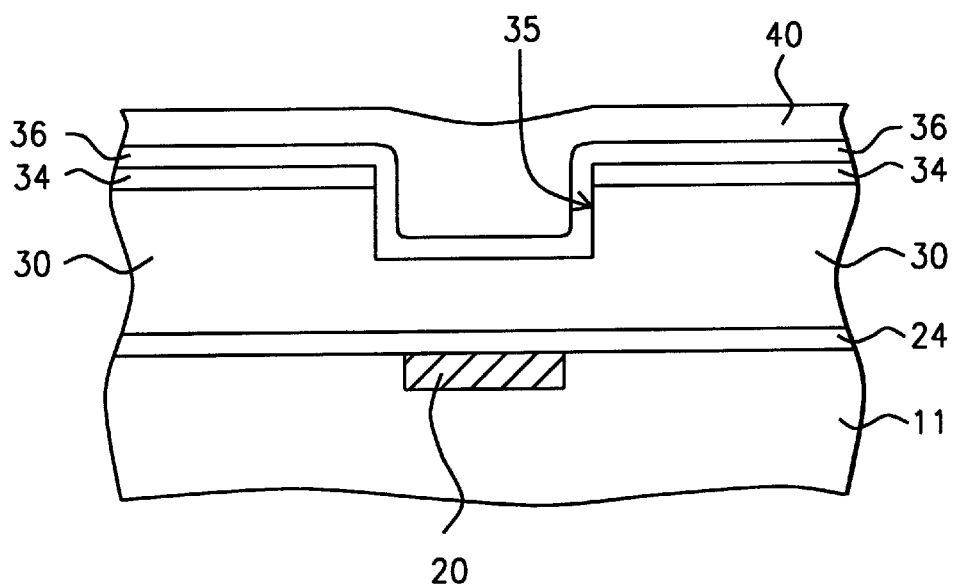

Referring to FIG. 5A, a second barrier layer (e.g. temporary etch stop layer) (36) is formed over the hard mask layer (34) and on the bottom and sidewalls of the trench (35). The second barrier layer (36) can be composed of titanium nitride, titanium, tantalum, or tantalum nitride. An important feature of the the second barrier layer (36) is that it has an etch rate approximately equal to the etch rate of the first barrier layer (24). The etch rate ratio of the second barrier layer (36) to the first barrier layer (24) using a $CF_4/Ar/O_2$ reactive ion etch is between about 1:1 and 1:1.2. The second barrier layer (36) preferably has a thickness of between about 250 Angstroms and 350 Angstroms. A key advantage of the present invention is that, because the trench is etched before the via, the second barrier layer (36) does not extend beyond the trench (35) causing line-to-line capacitance degradation.

Still referring to FIG. 5A, an organic bottom anti-reflective coating (barc) layer (40) is formed on the second barrier layer (36). The barc layer (40) can be comprised of organic barc or resin. Due to its non-conformal fill properties, the barc layer (40) preferably fills the trench (35) while it has a thickness of between about 4000 Angstroms and 8000 Angstroms over the hard mask layer (34).

Figure 5B:
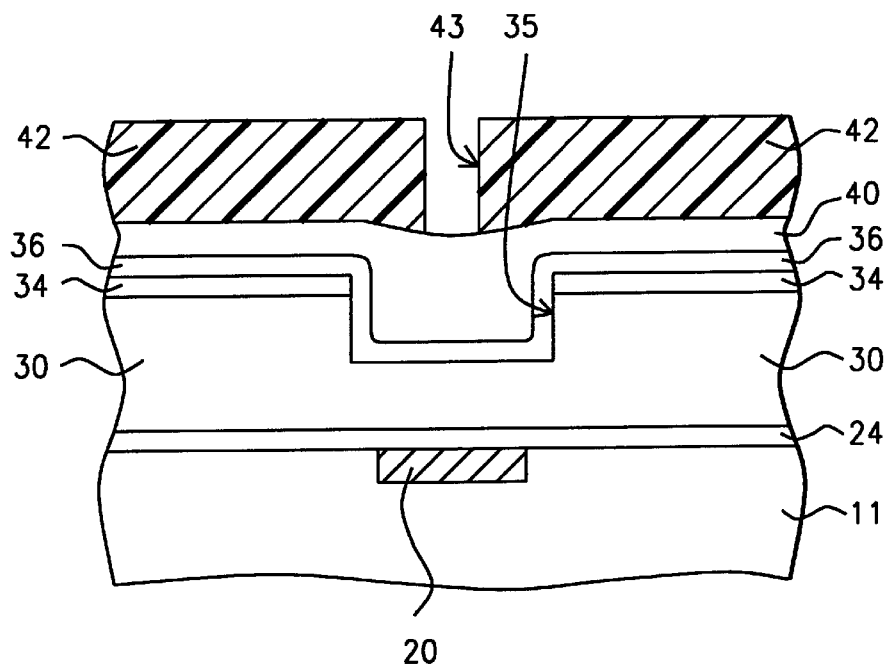
Figure 6A:
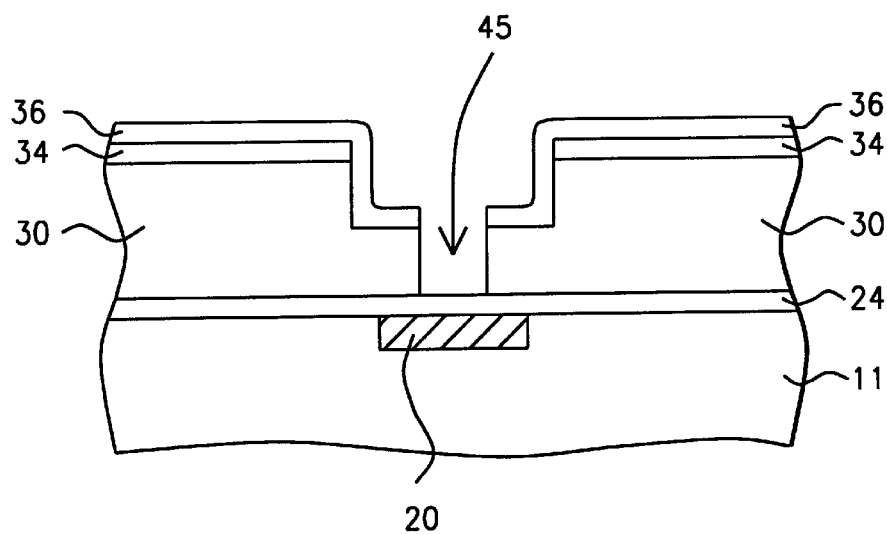

Referring to FIG. 6A, the bottom anti-reflective coating layer (not shown), the second barrier layer (36), and the dielectric layer (30) are patterned to form a via opening (45). The via opening (45) is preferably formed by photolithography, using a photoresist mask (42) having an opening (43) over the intended location of the via opening as shown in FIG. 5B.

Referring to FIG. 6A, the barc layer (not shown) is etched through the opening in the photoresist mask (not shown) using a $N_2/H_2$ or $N_2/O_2$ reactive ion etch, extending the opening through the barc layer. The hard mask layer (34) is then etched through the opening in the photoresist mask and the barc layer using a $CF_4/Ar/O_2$ reactive ion etch, extending the opening through the hard mask layer (34). The low-K dielectric layer (30) is then etched through the opening in the photoresist mask, the barc layer, and the hard mask layer (34) and stopping on the first barrier layer (24). The low-K dielectric layer (30) can be etched using a reactive ion etch comprising $N_2/O_2$, $N_2/H_2$, or other additives, preferably an $N_2/O_2$ reactive ion etch, to form a via opeing (45). The second barrier layer (36) prevents the etch from attacking the low-K dielectric layer (30) at the edge of the via opening (45).

The photoresist mask (42) and the barc layer (40) are removed by the etch described above which extends the via opening (45) through the low-K dielectric layer (30). Since the photoresist mask (42) is similar in thickness to the depth of the trench (35), and since the $N_2/O_2$ etch has no selectivity between photoresist and organic material, both the photoresist mask and the barc layer are completely removed. The second barrier layer (36) acts as an etch stop for the etch in and adjacent to the trench (35).

Figure 6B:
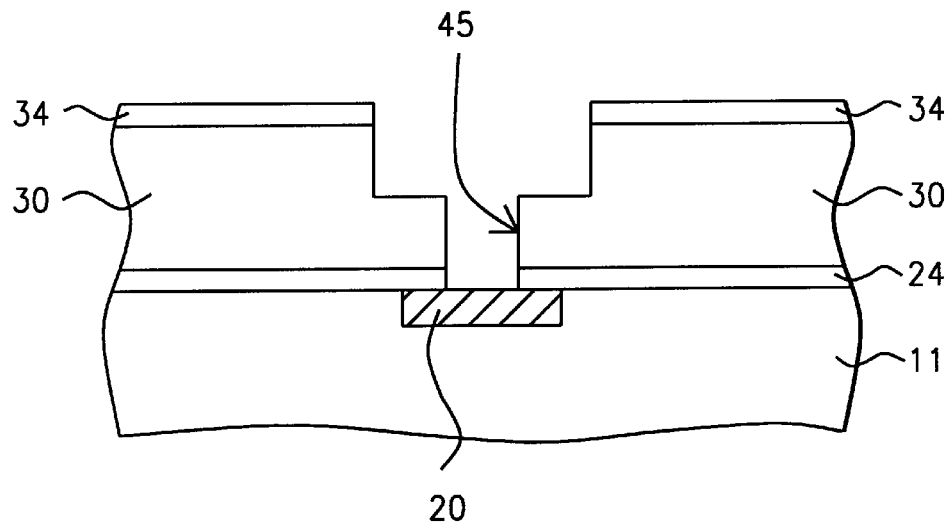

Referring to FIG. 6B, the first barrier layer (24) is removed from the bottom of the via opening (45) and the second barrier layer (36) is removed from the bottom of the trench (35) using a CF4/Ar/O2 reactive ion etch.

Figure 7:
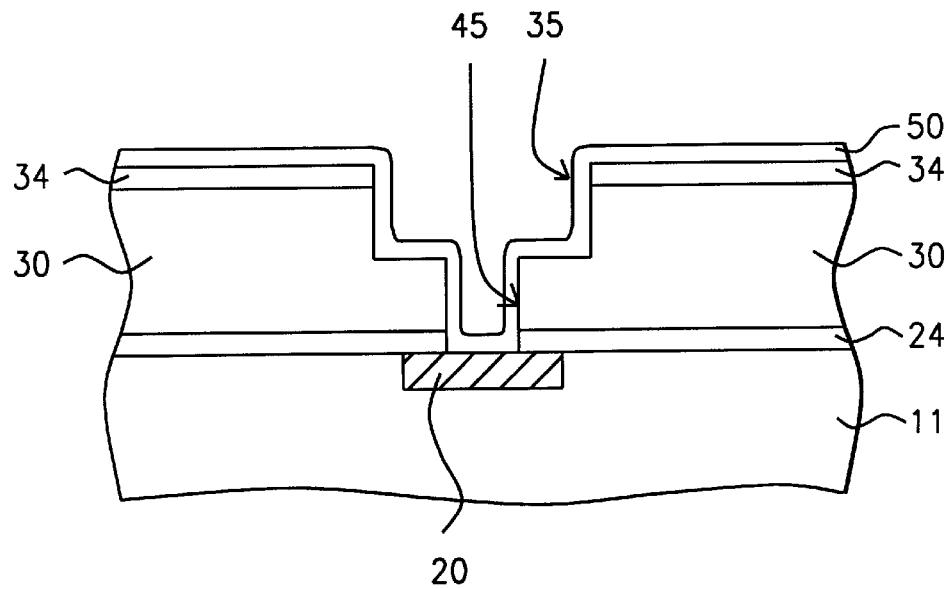

Referring to FIG. 7, a third barrier layer (50) is formed on the bottom and sidewalls of the trench (35), on the sidewalls of the via opening (45), and on the first metal pattern (20) through the via opening (45). The third barrier layer (50) preferably comprises tantalum nitride having a thickness of between about 300 Angstroms and 600 Angstroms. A metal plug (60) is formed in the via opening (45) and the trench (35) and planarized to form a dual damascene structure. The metal plug (60) is preferably formed using an ECD process.

What is claimed is:

1. A method for forming a dual damascene structure in a carbon-based, low-K material, comprising the steps of:
   a. providing a semiconductor structure having a first metal pattern thereover; said first metal pattern having a first barrier layer thereon;
   b. forming an organic dielectric layer on said first barrier layer;
   c. forming a hard mask layer on said organic dielectric layer;
   d. forming a trench through said hard mask layer and into said organic dielectric layer; said trench having a bottom and sidewalls;
   e. forming a second barrier layer over said hard mask layer and on the bottom and sidewalls of said trench;
   f. forming a bottom anti-reflective coating layer over said second barrier layer;
   g. patterning said bottom anti-reflective coating layer, said second barrier layer, and said organic dielectric layer to form a via opening; said via opening having a bottom comprising said first barrier layer and having sidewalls;
   h. removing said bottom anti-reflective coating layer;
   i. removing said first barrier layer from said bottom of said via opening and said second barrier layer from said bottom of said trench;
   j. forming a third barrier layer on said bottom and sidewalls of said trench, on said sidewalls of said via opening, and on said first metal pattern through said via opening; and
   k. forming a metal plug in said trench and said via opening to form a damascene structure.

2. The method of claim 1 wherein said first metal pattern is composed of copper and said first barrier layer is composed of silicon nitride having a thickness of between about 300 Angstroms and 500 Angstroms.

3. The method of claim 1 wherein said organic dielectric layer has a value of K of less than 3.0.

4. The method of claim 1 wherein said organic dielectric layer comprises a material having a value of K less than 3.0 and having a thickness of between about 1600 Angstroms and 7000 Angstroms.

5. The method of claim 1 wherein said hard mask layer comprises silicon oxynitride having a thickness of between about 1000 Angstroms and 3000 Angstroms.

6. The method of claim 1 wherein said second barrier layer comprises Tantalum nitride having a thickness of between about 250 Angstroms and 350 Angstroms, and said third barrier layer comprises Tantalum nitride having a thickness of between about 300 Angstroms and 600 Angstroms.

7. The method of claim 1 wherein said via opening and said trench are filled with copper using an ECD process.

8. A method for forming a dual damascene structure in a carbon-based, low-K dielectric layer, comprising the steps of:
   a. providing a semiconductor structure having a first metal pattern thereover; said first metal pattern having a first barrier layer thereon;
   b. forming an organic dielectric layer on said first barrier layer; said dielectric layer having a value of K of less than 3.0;
   c. forming a hard mask layer on said organic dielectric layer; said hard mask layer comprising silicon oxynitride;
   d. forming a trench through said hard mask layer and into said organic dielectric layer; said trench having a bottom and sidewalls;
   e. forming a second on the bottom and sidewalls of said trench; said second barrier layer comprising tantalum nitride;
   f. forming a bottom anti-reflective coating layer over said second barrier layer;
   g. forming a photoresist mask over said bottom anti-reflective coating;
   h. patterning said bottom anti-reflective coating layer, said second barrier layer, and said organic dielectric layer to form a via opening; said bottom anti-reflective coating layer being etched using a $N_2/H_2$ reactive ion etch; said second barrier layer being etched using a $CF_4/Ar/O_2$ reactive in etch; said orgnic dielectric layer being etched using a $N_2/O_2$ reactive ion etch, whereby said photoresist mask and said bottom anti-reflective coating layer are removed by the $N_2/O_2$ etch srtep, and whereby the edge of said organic dielectric layer adjacent said via opening is protected from faceting by said second barrier layer; said via opening having a bottom comprising said first barrier layer and having sidewalls;
   i. removing said first barrier layer from said bottom of said via opening and said second barrier layer from said bottom of said trench;
   j. forming a third barrier layer on said bottom and sidewalls of said trench, on said sidewalls of said via opening, and on said first metal pattern through said via opening; and
   k. forming a metal plug in said trench and said via opening to form a damascene structure.

9. The method of claim 8 wherein said first barrier layer and said second barrier layer are removed using a $CF_4/Ar/O_2$ chemistry.

10. The method of claim 8 wherein said first metal pattern is composed of copper and said first barrier layer is composed of silicon nitride having a thickness of between about 300 Angstroms and 500 Angstroms.

11. The method of claim 8 wherein said organic dielectric layer has a value of K less than 3.0 and a thickness of between about 1600 Angstroms and 7000 Angstroms.

12. The method of claim 8 wherein said hard mask layer has a thickness of between about 1000 Angstroms and 3000 Angstroms.

13. The method of claim 8 wherein said second barrier layer comprises Tantalum nitride having a thickness of between about 250 Angstroms and 350 Angstroms, and said third barrier layer comprises Tantalum nitride having a thickness of between about 300 Angstroms and 600 Angstroms.

14. The method of claim 8 wherein said via opening and said trench are filled with copper using an ECD process.

* * * * *

UNITED STATES PATENT AND TRADEMARK OFFICE
CERTIFICATE OF CORRECTION

PATENT NO. : 6,211,061 B1
DATED : April 3, 2001
INVENTOR(S) : Chao-Cheng Chen, Ming-Huei Lui, Jen-Chang Liu, Li-chih Chao, Chia-Shiung Tsai It is certified that error appears in the above-identified patent and that said Letters Patent is hereby corrected as shown below:

<u>Title page,</u>
Item [75], correct "Matou" to read -- Tainan -- and "Fang-mei" to read -- Yang-mei --

Signed and Sealed this

Twenty-second Day of January, 2002

Attest:

JAMES E. ROGAN
*Attesting Officer*     *Director of the United States Patent and Trademark Office*